United States Patent
Pinkerton et al.

[11] Patent Number: 5,985,049
[45] Date of Patent: Nov. 16, 1999

[54] MAGNETOSTRICTIVE COMPOSITES

[75] Inventors: Frederick Eugene Pinkerton, Shelby Township, Macomb County; Jan Francis Herbst, Grosse Pointe Woods; Tenneille Weston Capehart, Rochester Hills; Charles Bernard Murphy, Shelby Township, Macomb County; Earl George Brewer, Chesterfield Township, Macomb County, all of Mich.

[73] Assignee: General Motors Corporation, Detroit, Mich.

[21] Appl. No.: 09/084,470

[22] Filed: May 26, 1998

Related U.S. Application Data

[62] Division of application No. 08/673,550, Jul. 1, 1996.

[51] Int. Cl.⁶ ........................................... H01F 1/053
[52] U.S. Cl. .......................... 148/301; 148/303; 420/83
[58] Field of Search .................... 148/301, 303; 420/83

[56] References Cited

U.S. PATENT DOCUMENTS

| | | | |
|---|---|---|---|
| 4,152,178 | 5/1979 | Malekzadeh et al. | 148/103 |
| 4,378,258 | 3/1983 | Clark et al. | 148/100 |
| 5,792,284 | 8/1998 | Cedell et al. | 148/301 |

FOREIGN PATENT DOCUMENTS

WO 92/20829  11/1992  WIPO.

OTHER PUBLICATIONS

Peters, "Production and Evaluation of REFe$_2$–Nickel Composite Magnetostrictive Materials," Final Report to Naval Electronic Systems Command Contract No. N00039–77–0108, Jan. 1979.

Peters et al, "Nickel Composite Magnetostrictive Material Research for Ultrasonic Transducer," Final Report to Naval Electronic Systems Command Contract No. N00039–76–C–0017, Jan. 1977.

Sandlund et al, "Magnetostriction, Elastic Moduli, and Coupling Factors of Composite Terfenol–D," *Journal of Applied Physics*, vol. 75, No. 10, May 15, 1994, pp. 5656–5658.

*Primary Examiner*—John Sheehan
*Attorney, Agent, or Firm*—George A. Grove

[57] ABSTRACT

Composite bodies of magnetostrictive materials of the type RE-Fe$_2$, where RE is one or more of the rare earth elements, preferably samarium or terbium, can be suitably hot pressed with a matrix metal selected from the group consisting of aluminum, copper, iron, magnesium or nickel to form durable and machinable magnetostrictive composites still displaying appreciable magnetostrictive strains.

7 Claims, 12 Drawing Sheets

MAGNETOSTRICTIVE COMPOSITES

This is a division of application Ser. No. 08/673,550 filed on Jul. 1, 1996.

TECHNICAL FIELD

This invention relates to composites of magnetostrictive materials that combine appreciable magnetostriction with suitable mechanical properties to permit use in aggressive environments such as automotive applications and the like. This invention also pertains to methods for the manufacture of such magnetostrictive composites.

BACKGROUND OF THE INVENTION

Magnetostriction occurs when a material on exposure to a magnetic field develops significant strain: at room temperature, sample dimensions can change by as much as fractions of a percent. Conversely, the straining of a magnetostrictive material changes its magnetization state.

Magnetostrictive materials have been used with electromagnetic actuators to form transducers which serve as, for example, ultrasonic generators or fine control valves for the metering of fluids. In these applications, variation of the magnetic field is employed to produce varying strains in the magnetostrictive material to produce a mechanical output. Conversely, a suitable magnetostrictive material might be employed as a torque or force sensor. In fact, such materials are being considered as torque sensors in the form of a magnetostrictive ring mounted on a shaft such as an automobile steering shaft. Torque in such a shaft would strain the magnetostrictive ring, giving rise to a detectable change in the ring's axial magnetization.

Maximizing device performance naturally suggests using materials having large saturation magnetostriction, $\lambda_s$, which is a dimensionless measure of the field-induced strain frequently expressed in units of parts per million (ppm). Extremely high values of $\lambda_s$ are found in rare earth-iron compounds such as the terbium-iron compound, $TbFe_2$, where $\lambda_s$ equals 1750 ppm for a polycrystalline sample. Unfortunately, the rare earth-iron compounds are very brittle materials having little tensile strength, an unpropitious characteristic for automotive applications requiring good mechanical properties. On the other hand, stronger and tougher materials such as steels have very limited magnetostriction: T250 maraging steel, which is currently being evaluated in torque sensors, has a $\lambda_s$ of only ~30 ppm. The wide gulf between these two extremes offers ample opportunity and challenge for developing new magnetostrictors combining good magnetostriction with satisfactory mechanical properties.

The prospect of embedding magnetostrictive powder in a strengthening matrix has been sporadically explored as follows.

The Clark and Belson patent, U.S. Pat. No. 4,378,258, entitled "Conversion Between Magnetic Energy and Mechanical Energy," reported sintering cold-pressed pellets of $ErFe_2$ with nickel and $TbFe_2$ with iron. Few details of the properties of these materials were provided. They retain some magnetostriction, but as it turns out, the sintered bodies are brittle and of insufficient strength for many applications such as automotive sensor applications. Clark and Belson also produced resin-bonded composites of the $RE-Fe_2$ (RE=rare earth) magnetostrictive compounds, but these materials also are of insufficient mechanical strength for automotive applications.

Peters and Huston of the International Nickel Company attempted to prepare composites of $SmFe_2$ in nickel by sintering, by extrusion and by hot pressing, but they obtained values of magnetostriction which were only modestly larger than that of the nickel alone and did not recommend the practices. See D. T. Peters and E. L. Huston, "Nickel Composite Magnetostrictive Material Research for Ultrasonic Transducer," January 1977, Naval Electronic Systems Command Contract No. N00039-76-C-0017, U.S. Department of Commerce National Technical Information Service, ADA 040336; and D. T. Peters, "Production and Evaluation of ReF(2)-Nickel Composite Magnetostrictive Materials," Final Report, January 1979, Naval Electronic Systems Command Contract No. N00039-77-C-0108, U.S. Department of Commerce National Technical Information Service, ADA 066947.

Others have also made magnetostrictive composites of $RE-Fe_2$ materials in epoxy binders. However, none of the above-referenced attempts have produced composites of suitable magnetostriction and mechanical properties to serve as, for example, torque sensors in demanding environments such as automotive applications.

An example of a torque sensor such as might be used in an automotive application is found in I. J. Garshelis, *IEEE Trans. Magn.* 28, 2202 (1992). Garshelis describes a magnetostrictive ring in which circumferential magnetization is maintained by a large static hoop stress, the hoop stress also serving to rigidly attach the ring to the shaft carrying the torque. Stresses in the ring associated with the torque tilt the magnetization away from the circumferential direction. An axial component of magnetization develops and in turn produces a magnetic field in the space around the ring which is detected by a magnetic field intensity sensor; the magnetic field intensity is used to measure the torque in the shaft. An example of the application of such a shaft in an automobile, of course, is a steering column shaft. However, the stresses on the magnetostrictive ring can be quite high, and none of the above-described magnetostrictive materials provide a desirable combination of mechanical strength and large magnetostriction. Accordingly, there remains a need for the development of materials suitable for such applications.

SUMMARY OF THE INVENTION

This invention comprises synthetic, hot pressed composites consisting essentially of a magnetostrictive powder embedded in a metal matrix of a suitably deformable metal such as iron, aluminum, magnesium, nickel or copper. Magnetostrictive materials of the $RE-Fe_2$ compounds are preferred because of their excellent values of saturation magnetostriction $\lambda_s$. Thus, any of the rare earth elements such as yttrium, lanthanum, cerium, praseodymium, neodymium, samarium, gadolinium, terbium, dysprosium, holmium, erbium, thulium, ytterbium or lutetium or mixtures of them may be considered suitable. However, $SmFe_2$ or $TbFe_2$ are preferred because of their high values of magnetostriction. $SmFe_2$ is especially preferred at this time because of its relatively low cost and ready availability. The value of $\lambda_s$ for $SmFe_2$ is −1560 ppm. The negative value of magnetostriction means that in contrast to $TbFe_2$ ($\lambda_s$=1750 ppm), which expands in the direction of an applied magnetic field, $SmFe_2$ contracts in the field direction and expands laterally. Its relative contraction (strain) in the dimension parallel to the applied field is given by $\lambda_\parallel$ it, which has been measured by the inventors on a pure polycrystalline $SmFe_2$ ingot to be $\lambda_\parallel$=−1150 ppm.

Most of the examples in the specification will refer to $SmFe_2$. However, it is to be recognized that other $RE-Fe_2$ materials may be employed where RE may be any desired rare earth element or mixtures of rare earth elements. Single phase RE-Fe$_2$ powders are preferred. They may be prepared either from annealed ingot or from melt spun ribbons to obtain low coercivity (H$_{ci}\approx$0.3 kOe) or high coercivity (H$_{ci}\approx$3 kOe) magnetostrictive powder, respectively. Consolidation of the magnetostrictive powder with the particulate matrix metal is accomplished by hot pressing. Preferably, the matrix metal is deformable at temperatures and pressures which permit bulk consolidation by hot pressing. In the present embodiment, the particle size of the matrix material is roughly the same as that of the magnetostrictive material, but it is to be understood that the size distributions of matrix particles and magnetostrictive particles could be tailored to optimize densification of the composite. The magnetostrictive powder and matrix powder are mixed in suitable proportions. Suitably, the matrix powder constitutes from 20% to 80% by volume of the total composite. In general, however, a preferred balance of properties is obtained when roughly 30% to 50% by volume of the magnetostrictive powder is employed.

The powders are uniformly mixed and hot pressed. A preliminary compact of the mixture could be prepared at ambient condition, but the mixture is ultimately hot pressed at a temperature selected to (1) facilitate the flow of the matrix material so that it substantially envelopes the particles of magnetostrictive powder and (2) minimize decomposition of the magnetostrictive powder. The duration of the hot pressing operation is preferably just a period of a few minutes, for example, four to 20 minutes, a period chosen to minimize alteration or degradation of the magnetostrictive particles. The resultant compacts have very useful properties. They retain a very useful proportion of the magnetostriction of the starting material. They are hard, tough and may even be machined for application as a torque sensor ring as described above.

While the invention has been described in terms of a brief summary, other objects and advantages of the invention will become more apparent from a detailed description thereof which follows. In this detailed description, reference will be had to the drawings.

DESCRIPTION OF PREFERRED EMBODIMENTS

Figure 1:
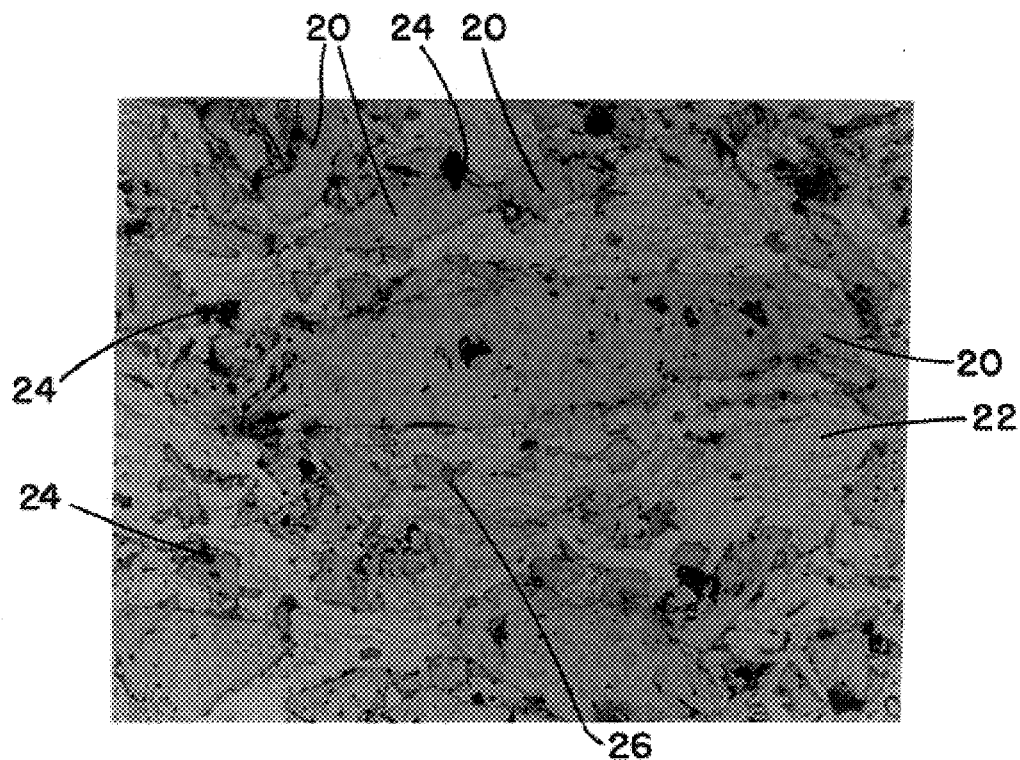
FIG. 1 is a photomicrograph at 400× magnification of a transverse section of a ½-inch disc of SmFe$_2$ ingot particles (50 vol %) in Fe matrix, hot pressed at 610° C., 95 MPa pressure.

As summarized above, the composites of this invention are hot pressed RE-Fe$_2$/M composites, where RE is one or more of the rare earth metal elements and M is a suitably deformable matrix metal that substantially preserves the RE-Fe$_2$ magnetostrictive compound at hot pressing temperatures. Suitable examples of the M constituent are aluminum, copper, iron, magnesium and nickel. As stated above, terbium and samarium are the preferred rare earth constituents because of the high magnetostriction of their compounds with iron, but SmFe$_2$ is especially preferred because of the ready availability and relatively low cost of samarium and used in the following examples for convenience and consistency of composition for comparison of data.

Also as stated above, the RE-Fe$_2$ magnetostrictive material may be employed as an ingot powder or as a melt-spun ribbon powder as will be further described below.

EXAMPLE OF PREPARATION OF MAGNETOSTRICTIVE POWDERS

SmFe$_2$ Ingot Powder

Starting ingots having the Sm$_{1.05}$Fe$_2$ stoichiometry were produced by induction melting the elemental constituents in an argon atmosphere. The excess samarium was introduced to compensate for the loss of samarium due to its high vapor pressure during melting and subsequent long term anneal. Electron microprobe analysis revealed the as-cast ingot to be a multi-phased mixture of SmFe$_2$, Sm$_2$Fe$_{17}$, SmFe$_3$ and elemental Sm. As-cast ingots have been homogenized by annealing for either 100 hours or 270 hours at 700° C. to obtain single phase ingots of SmFe$_2$. Both anneals generated identical single-phased SmFe$_2$ ingots as determined by x-ray diffraction analysis.

Considerable samarium loss occurs during the heat treatment, and the heat treated ingot consists of a pure SmFe$_2$ core comprising the bulk of the sample and surrounded by a multi-phase skin of samarium-depleted material about one millimeter thick. The skin was removed and the remaining ingot ground to powder by high energy ball milling under methanol for 10 minutes in a SPEX 8000 mixer/mill to obtain $SmFe_2$ powder. The particle sizes were in the range of about 10 to 250 micrometers.

Melt-Spun $SmFe_2$ Ribbon Powder

Induction melted ingots of $SmFe_2$ or $(SmFe_2)_{97.5}Al_{2.5}$ were prealloyed for use in melt spinning. Aluminum was initially incorporated in some of the alloys to enhance the formation of amorphous material. It has subsequently been found that amorphous $SmFe_2$ can be formed without aluminum additions. The $SmFe_2$ ingots used for melt spinning did not include excess samarium. Homogeneity is provided by melt spinning itself, and no long term anneal is required so that there is less potential for samarium to be lost during processing. Pieces of the ingot were induction melted in a quartz crucible under argon inert gas atmosphere and melt spun through a 0.6 mm diameter orifice onto the surface of a rapidly-spinning, chromium-plated copper quench wheel. The quench rate was adjusted by changing the velocity $v_s$ of the wheel. The diameter of the wheel was about 10 inches.

$SmFe_2$ ribbons melt spun at $v_s$=20 or 30 m/s were completely amorphous as demonstrated by their powder x-ray diffraction pattern. Differential scanning calorimetry of $v_s$=30 m/s ribbons revealed the crystallization temperature to be $T_x$=560° C. for aluminum-free $SmFe_2$. After crystallization by heat treatment at 700° C. for 15 minutes, the ribbons were nearly single phase $SmFe_2$ as shown by x-ray diffraction. A few impurity phase peaks were barely detectable, suggesting that the final ribbons may have had a slight samarium deficiency. Powders were obtained from the ribbons by high energy ball milling for 10 minutes. The particle sizes were in the range of about 10 to 75 micrometers.

The ingot and melt-spun preparation methods are distinguished mainly by the resultant magnetic properties. Whether amorphous or crystallized, the melt-spun ribbons of $SmFe_2$ have significant intrinsic coercivity $H_{ci}$ of about 2.4 to 2.6 kOe. In contrast, the ingot-based $SmFe_2$ has substantially lower $H_{ci}$ of about 0.3 kOe.

Synthesis of Hot Pressed Composites

For purposes of illustration, the synthesis of hot pressed composites of $RE-Fe_2/M$ will be described in terms of composites of $SmFe_2$ and either aluminum or iron powder. As stated above and as will be exemplified below, other matrix metals may be employed as well as other rare earth metal constituents of the magnetostrictive powder.

Powders of $SmFe_2$ (ingot, amorphous ribbon or crystallized ribbon) were blended to known volume fractions with either aluminum or iron powder and thoroughly homogenized by hand. The $SmFe_2$ magnetostrictive powder is essentially black, and the iron or aluminum powder is considerably brighter. The powders were mixed with a spatula until a uniform gray mixture was obtained. Mixtures of various matrix metal fill fractions have been prepared as described below.

Approximately one cubic centimeter of mixed powder was taken for hot pressing under vacuum in an inductively-heated 12.7 mm ID graphite die using tungsten titanium carbide rams. Unheated powder was loaded into an unheated die and supported there by the lower ram. Sufficient powder was added to produce cylindrical disks six to seven millimeters in height. The die was equipped with a transversely penetrating thermocouple located within ⅛ inch of the internal wall of the die. The output from the thermocouple was used to control the heating of the die, which served as a susceptor for the induction heating coil.

The inductor was then turned on, and the die and contents were rapidly heated to a predetermined hot pressing temperature. The hot pressing temperature is largely dependent upon the selected matrix metal and the desire to avoid degradation of the rare earth-iron compound or interactions between the matrix metal and the magnetostrictive powder. Examples of hot pressing temperatures for aluminum and iron matrix metals are illustrated further below.

Figure 2:
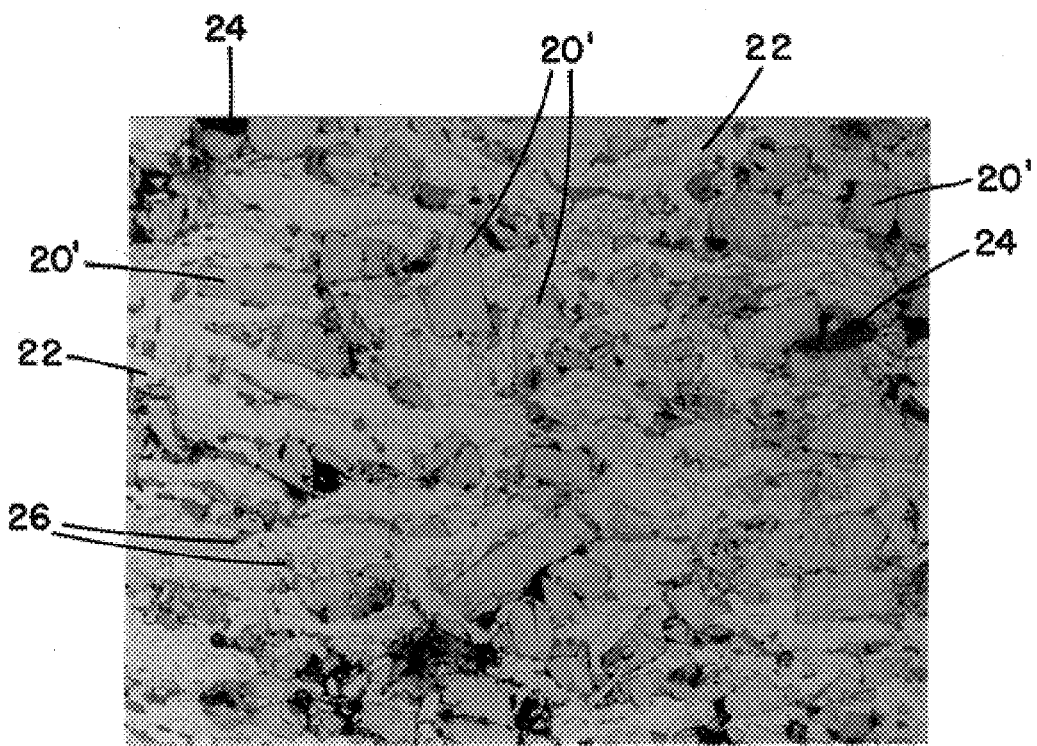
FIG. 2 is a photomicrograph at 400× magnification of a transverse section of a ½-inch disc of SmFe$_2$ melt-spun ribbon particles (50 vol %) in Fe matrix, hot pressed at 610° C., 95 MPa pressure.

In the case, for example, of a $SmFe_2$/50 vol % iron mixture to be hot pressed at 610° C., the mixture was heated in the die with no applied pressure to a temperature of about 520° C. whereupon the rams were activated to press forces of about 10 to 12 kN, which translate to compacting pressures of 79 to 95 MPa. The heating rate was 50° C. per minute. As soon as the temperature of the thermocouple in the die adjacent the cavity reached 620° C., heating was terminated and the upper ram removed and the lower ram raised to expel the hot pressed compact from the die cavity. Thus, hot pressing is a relatively fast process. The specimen spends five minutes or less at an elevated temperature. It is perceived that this practice is superior to sintering because of the much shorter heating time, which provides an advantage in minimizing $SmFe_2$ decomposition or any undesirable interaction between the matrix metal and the magnetostrictive constituent. The heating renders the matrix metal more deformable and enables it to flow around the magnetostrictive powder particles to form a hot pressed compact that is characterized by particles of the magnetostrictive material in a continuous matrix. FIGS. 1 and 2 are photomicrographs illustrating cross sections of compacts in which the matrix metal is iron and the magnetostrictive material is $SmFe_2$ ingot powder (50 vol %) in FIG. 1 and crystallized $SmFe_2$ ribbon melt spun at 30 m/s (50 vol %) in FIG. 2. The ejected hot pressed composite is rapidly cooled in a stream of cold nitrogen gas.

FIG. 1 is a photomicrograph at 400× magnification of a portion of a transverse section of a ½-inch diameter disc of $SmFe_2$ ingot particles/50% Fe hot pressed at 610° C. under 95 MPa pressure. $SmFe_2$ ingot powder particles are seen at 20. The iron matrix is seen at 22. The compact is not fully dense as indicated by the presence of pores 24. It is believed that there may be an indication at 26 of the presence of a non-magnetostrictive reaction product (i.e., reaction between $SmFe_2$ and iron during hot pressing).

FIG. 2 is a photomicrograph at 400× magnification of a portion of a transverse section of a ½-inch diameter disc of $SmFe_2$ melt-spun particles/50% Fe composite also hot pressed at 610° C. and 95 MPa pressure. $SmFe_2$ ribbon particles are seen at 20' and the iron matrix at 22. Microstructural pores 24 are present. Again, there are indications of reaction products 26.

In both FIG. 1 and FIG. 2, a length of one inch (25.4 mm) is equivalent to about 63.5 $\mu$m.

Magnetostrictive Properties

Physical properties of $SmFe_2$/50 vol % Fe and $SmFe_2$/50 vol % aluminum composites hot pressed at 610° C. and 540° C., respectively, are shown in Table 1.

TABLE 1

| | SmFe$_2$/50% Fe (610° C.) | | SmFe$_2$/50% Al (540° C.) | | | T250 |
| --- | --- | --- | --- | --- | --- | --- |
| | Crystallized Ribbons | Ingot | Amorphous Ribbons[a] | Crystallized Ribbons | Ingot | Maraging Steel |
| $\lambda_\parallel$ (H = 19 kOe) (ppm) | −286 | −443 | −126 | −280 | −339 | 29 |
| $B_r$ (kG) | 4.5 | 1.0 | | 1.6 | 0.3 | |
| $H_{ci}$ (kOe) | 0.4 | 0.2 | | 3.2 | 0.2 | |
| $4\pi M$(H = 6 kOe) (kG) | 9.7 | 7.4 | | 2.0 | 1.7 | |
| $\rho$ (g/cm$^3$) | 6.8 | 7.0 | 4.7 | 4.9 | 5.1 | 8.0 |
| $\rho/\rho_{theoretical}$ (%) | 86 | 86 | 89 | 94 | 92 | |
| E (GPa) | 56 | 57 | | 64 | 60 | 207 |
| Rockwell hardness | 59 (B) | 60 (B) | 63 (B) | ≦49 (B) | ≦62 (B) | 31 (C) |

[a]The ribbon composition of this sample was (SmFe$_2$)$_{97.5}$Al$_{2.5}$.

Referring to the above table, the ratio $\rho/\rho_{thieoretical}$ compares the measured density $\rho$ with the calculated theoretical density $\rho_{theoretical}$ obtained from a weighted average of the density of the constituents. These values range from 86 to 94 percent of full density, suggesting that significant porosity remains in these specific consolidated samples. The ratio is, at best, a rough estimate since $\rho_{theoretical}$ does not take into account the densities of reaction products (if any) due to partial decomposition of the SmFe$_2$.

The hardness values were obtained using a standard hardness tester on the Rockwell B scale. The Rockwell hardness typically registers around 60 Rockwell B. By comparison, the T250 maraging steel is, of course, much harder—about 31 Rockwell C.

Young's modulus, E, for these samples was estimated in compression by applying a pressure of approximately 1 MPa and measuring the resulting small deformations parallel to the applied force with a constantan strain gauge glued to the cylindrical wall of the disks. For all of these samples, E is found to be roughly 60 GPa. This compares with 207 GPa for polycrystalline iron and 69 GPa for polycrystalline aluminum.

The magnetic properties were obtained from demagnetization curves. The nonmagnetic aluminum matrix produces composites whose magnetization closely follows that of the parent SmFe$_2$ material reduced by the volume fraction. The remanence of the ribbon composite is $B_r$=1.6 kG and is very close to one-half of the $B_r$=3.4 kG value characteristic of the crystallized ribbons. The coercivity of this sample, $H_{ci}$=3.2 kOe, is actually significantly larger than the coercivity of the starting ribbons, $H_{ci}$=2.4 kOe; evidently the composite microstructure supplies additional magnetic hardening. In contrast to the aluminum composites, the magnetic iron matrix dominates the magnetization of its composites.

In the above table, the component of magnetostriction parallel to the applied magnetic field, $\lambda_\parallel$, was measured at room temperature using a constantan strain gauge. The $\lambda_\parallel$ values in Table 1 were measured in an applied field of 19 kOe and are given in parts per million.

It should be noted that the intent of melt spinning in this invention is to produce magnetically hard SmFe$_2$ material for inclusion into the composite. As Table 1 shows, useful magnetostriction is obtained even with amorphous SmFe$_2$ ribbons; however, crystallized ribbons are preferred. As in the examples described here, crystalled SmFe$_2$ ribbons can be obtained by heat treatment of the amorphous ribbons prior to fabricating a composite. In the case of composites, such as those with Fe, where the hot pressing temperature is above the crystallization temperature, the heat treatment is not required, since crystallization will take place during hot pressing. Finally, those well versed in the art of melt spinning will recognize that crystalline SmFe$_2$ ribbons can be formed directly during melt spinning by using suitable wheel speeds.

When all of the data of Table 1 are considered, it is seen that the composite magnetostrictors provide an excellent balance in both magnetostrictive properties and physical properties. Clearly, the physical properties are such that these materials can be used in automotive applications. Furthermore, it has been found that these materials are machinable: the 12.7 mm ID disks of 6 to 7 mm height could be drilled without breaking the disk. Quarter inch holes were drilled completely through the disks, leaving a cylinder or torus that remained intact and could provide the basis for a force gauge or torsion sensor.

ADDITIONAL EXAMPLES

SmFe$_2$ Fill Fraction and Hot Press Temperature

An additional series of examples were conducted using annealed, single-phased SmFe$_2$ ingot. Starting ingots having Sm$_{0.333}$Fe$_{0.667}$ stoichiometry were cast by induction melting and annealed for 100 hours to produce SmFe$_2$ single phase material. The ingots were high energy ball milled for five minutes to obtain SmFe$_2$ powder having a particle size of 10 to 250 $\mu$m. The powder was mixed with either iron or aluminum powder and hot pressed at 95 MPa to obtain a composite cylinder 12.7 mm in diameter and about 7 mm high. A first series of composites was hot pressed at 610° C. (Fe) or 540° C. (Al) in which the volume fraction of SmFe$_2$ was varied between 20% and 100%. A second series of composites was fabricated in which the SmFe$_2$ fraction was fixed at 50% by volume while the hot press temperature was varied between 530° C. and 730° C. for iron and between 500° C. and 620° C. for aluminum.

In these examples, magnetostriction was measured with a technique slightly different from the method described above for measuring $\lambda_\parallel$. In this second arrangement, two strain gauges simultaneously measure both the strain $\lambda_\parallel$ parallel to the direction of H and the strain $\lambda_\perp$ perpendicular to H, providing a direct measurement of the difference ($\lambda_\parallel - \lambda_\perp$). In a magnetic field large enough to saturate the magnetostrictive response, this difference is proportional to the saturation magnetostriction $\lambda_s$: $\lambda_s = \frac{2}{3}(\lambda_\parallel - \lambda_\perp)$. For an isotropic magnetostrictor (as is often assumed to be the case for randomly oriented polycrystalline materials) $\lambda_s = \lambda_\perp$. Magnetostrictions were measured in magnetic fields up to ±19 kOe. The physical density $\rho$ was determined from the sample dimensions and weight. The hardness was obtained using a hardness tester on the Rockwell B scale.

Figure 3:
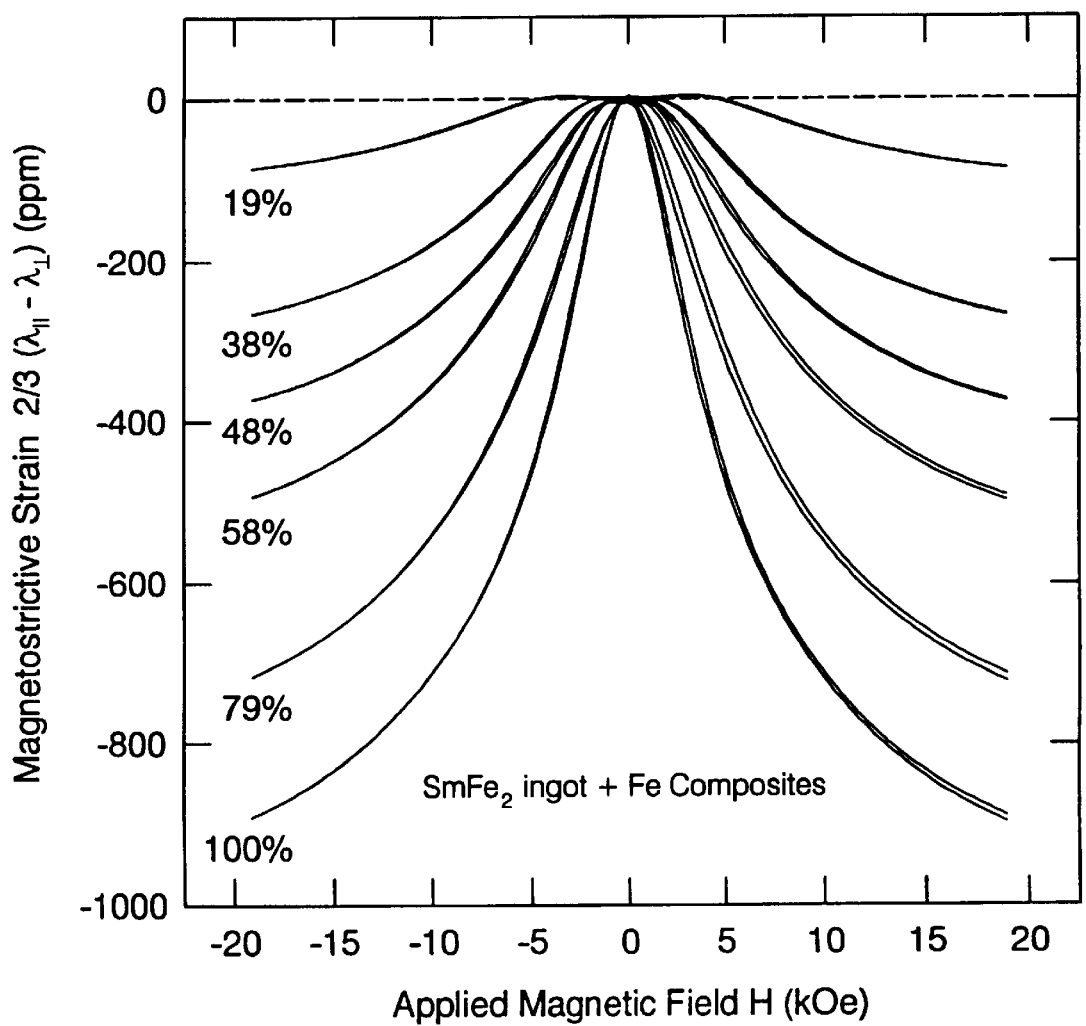
FIG. 3 is a graph of magnetostriction ⅔($\lambda_\parallel-\lambda_\perp$) as a function of applied magnetic field H for hot pressed SmFe$_2$/Fe composites made at various SmFe$_2$ fill fractions. The quantity $\lambda_\perp$ is the strain measured in a direction perpendicular to the applied field.
Figure 4:
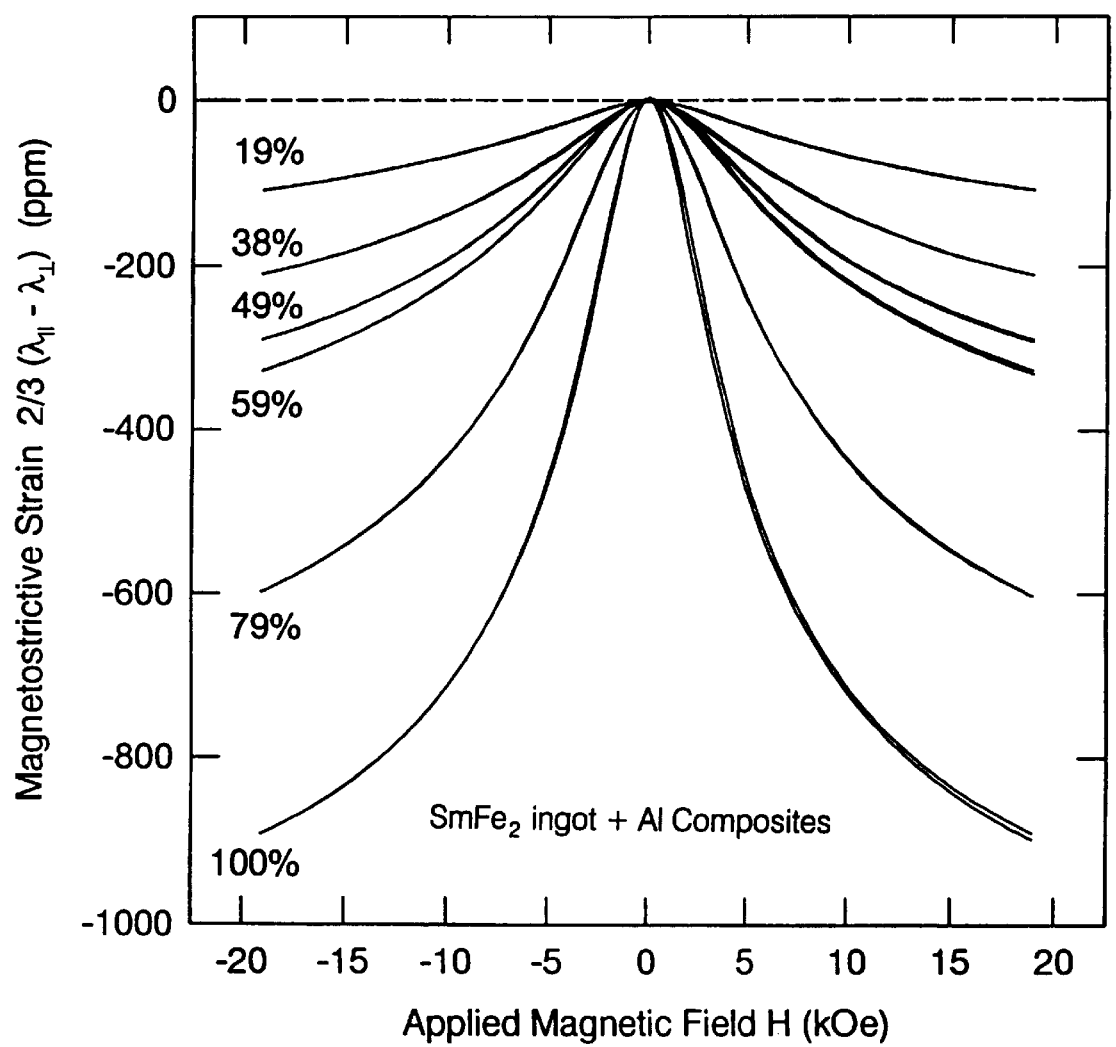
FIG. 4 is a graph of magnetostriction ⅔($\lambda_\parallel-\lambda_\perp$) as a function of applied magnetic field H for hot pressed SmFe$_2$/Al composites made at various SmFe$_2$ fill fractions.

The magnetostrictive strains as functions of the applied magnetic field H are shown for various SmFe$_2$ fill fractions in FIGS. 3 and 4 made with iron and aluminum, respectively.

In each test of the composites with different fill fractions, the magnetic field was varied continuously from +19 kOe to −19 kOe and back to +19 kOe. This accounts for the loops in each magnetostrictive strain curve. As expected, composites with larger $SmFe_2$ fill fractions show higher magnetostrictive strains.

None of the magnetostriction curves in FIGS. 3 and 4 reach saturation in the maximum applied field of 19 kOe. It becomes increasingly easy to saturate the magnetostriction as the $SmFe_2$ content increases, with the pure $SmFe_2$ sample having the most nearly saturated appearance.

Figure 5:
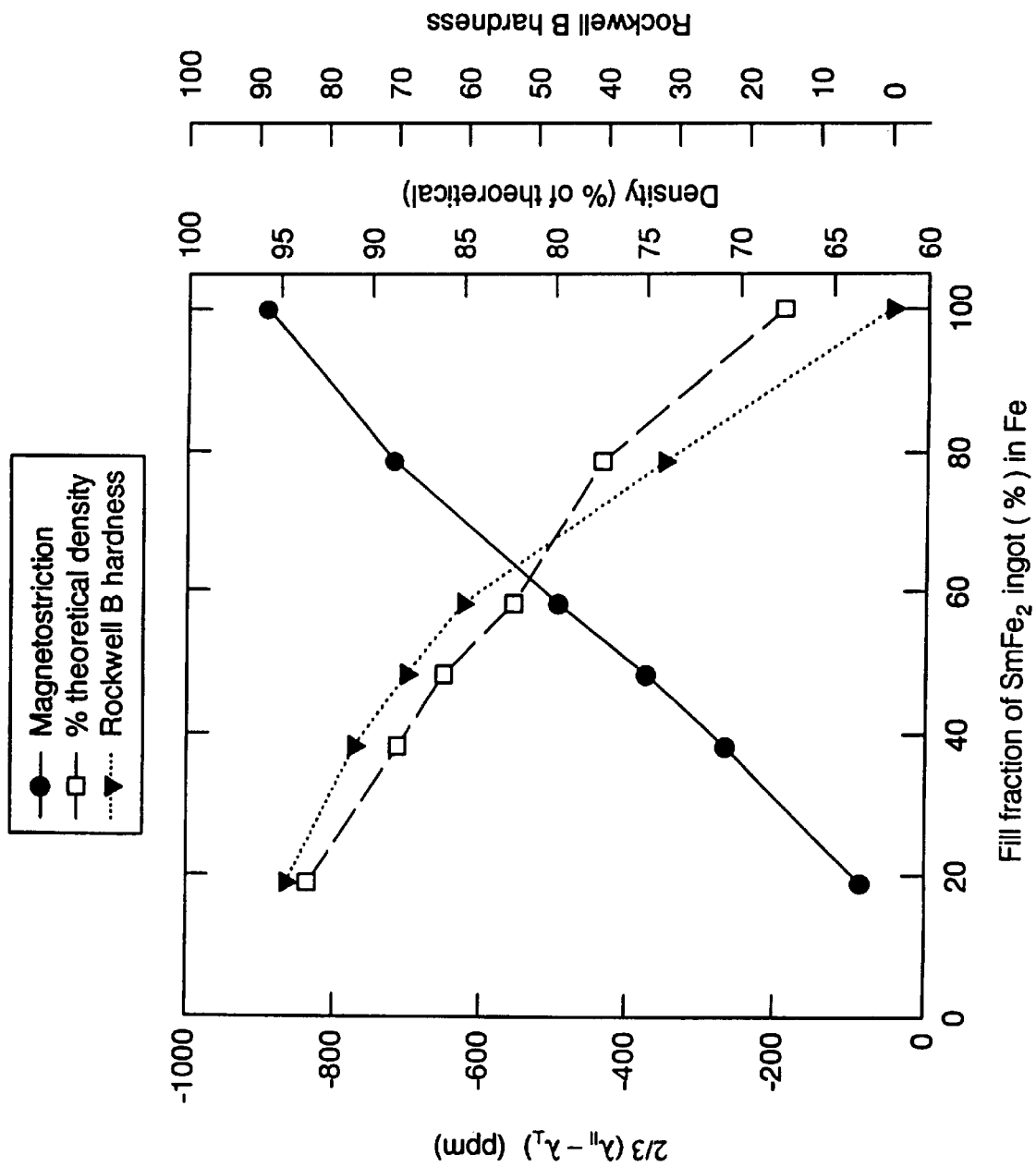
FIG. 5 consists of graphs of the dependence of the magnetostriction ⅔($\lambda_\parallel-\lambda_\perp$) at H=19 kOe (●), the density ρ normalized to the theoretical density ρ$_{theoretical}$ (□), and the hardness (▼) on the volume fraction of SmFe$_2$ in hot pressed composites made with an Fe matrix.

The dependence of $\lambda$ at 19 kOe on the $SmFe_2$ fill fraction is shown in FIG. 5 for the composites made with iron. Also shown is the physical density $\rho$ normalized to its theoretical value calculated from the volume fraction of the two constituents and the known densities of the $SmFe_2$ and iron components. The ratio $\rho/\rho_{theoretical}$ serves as a measure of the porosity of the sample. Thus, from FIG. 5 it can be discerned that the porosity at $SinFe_2$ fill fractions up to 50% is less than 15% and decreases as the $SmFe_2$ fraction drops. At high fill fractions, the porosity is quite large, reaching a value exceeding 30% in a sample comprised of pure hot $SmFe_2$ powder. Finally, the hardness is also shown in FIG. 5 as the filled inverted triangles. The pure $SmFe_2$ sample is too soft to register on the Rockwell B scale, but the hardness increases steadily as the $SmFe_2$ fraction decreases, reaching nearly 90 Rockwell B at low fill fraction.

Figure 6:
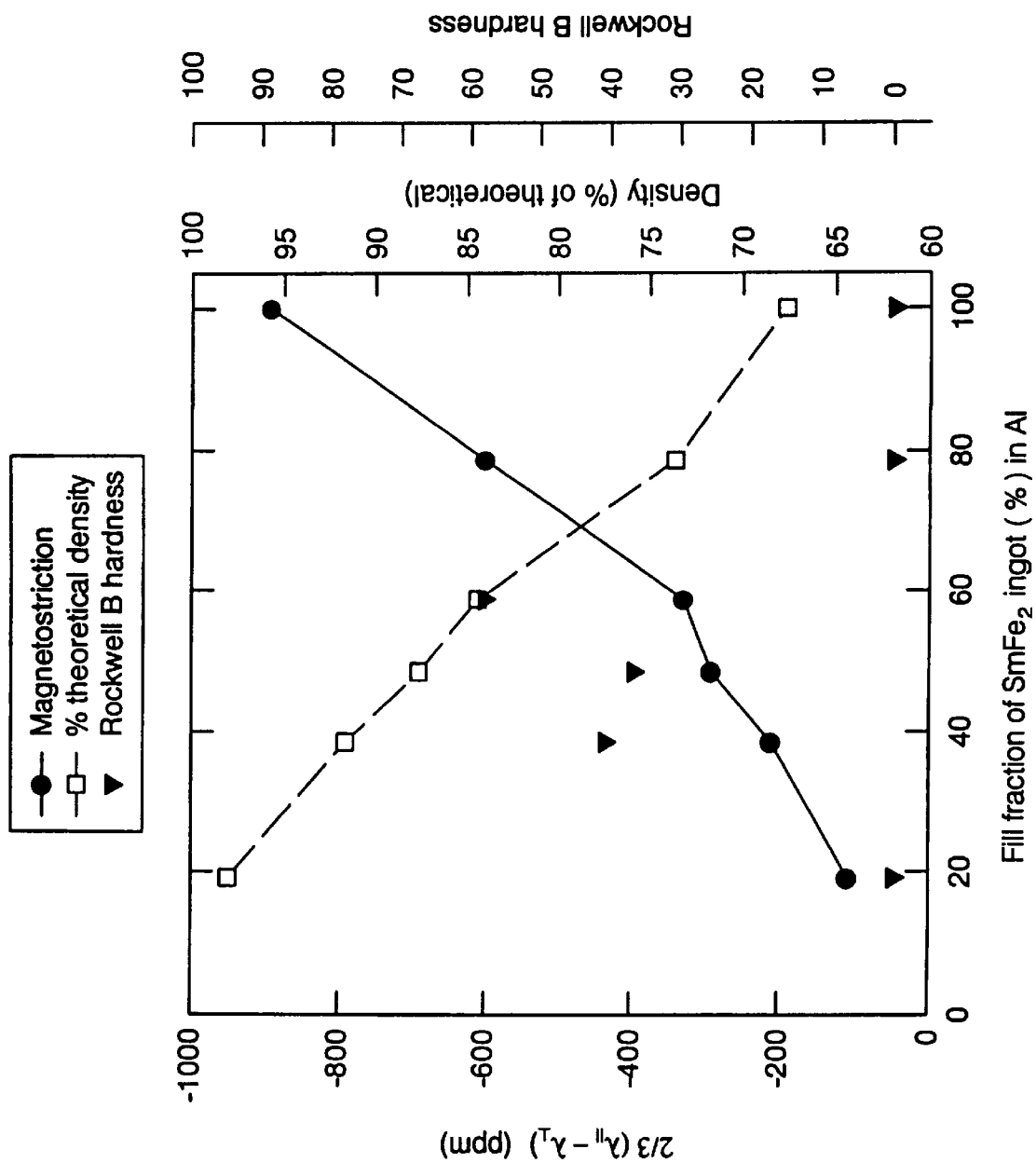
FIG. 6 consists of graphs of the dependence of the magnetostriction ⅔($\lambda_\parallel-\lambda_\perp$) at H=19 kOe (●), the density ρ normalized to the theoretical density ρ$_{theoretical}$ (□), and the hardness (▼) on the volume fraction of SmFe$_2$ in hot pressed composites with an Al matrix.

FIG. 6 shows similar data for composites made with aluminum. The trends in magnetostriction and density are very similar to those observed in the iron composites. The density of the aluminum composites tends to be slightly higher than the corresponding iron composites, probably because of the greater deformability of aluminum. The hardness is substantially reduced in the aluminum composites and also quite variable. This can be associated with the mechanical softness of annealed aluminum and suggests that the hardness of aluminum composites is quite sensitive to the details of the hot press.

Figure 7:
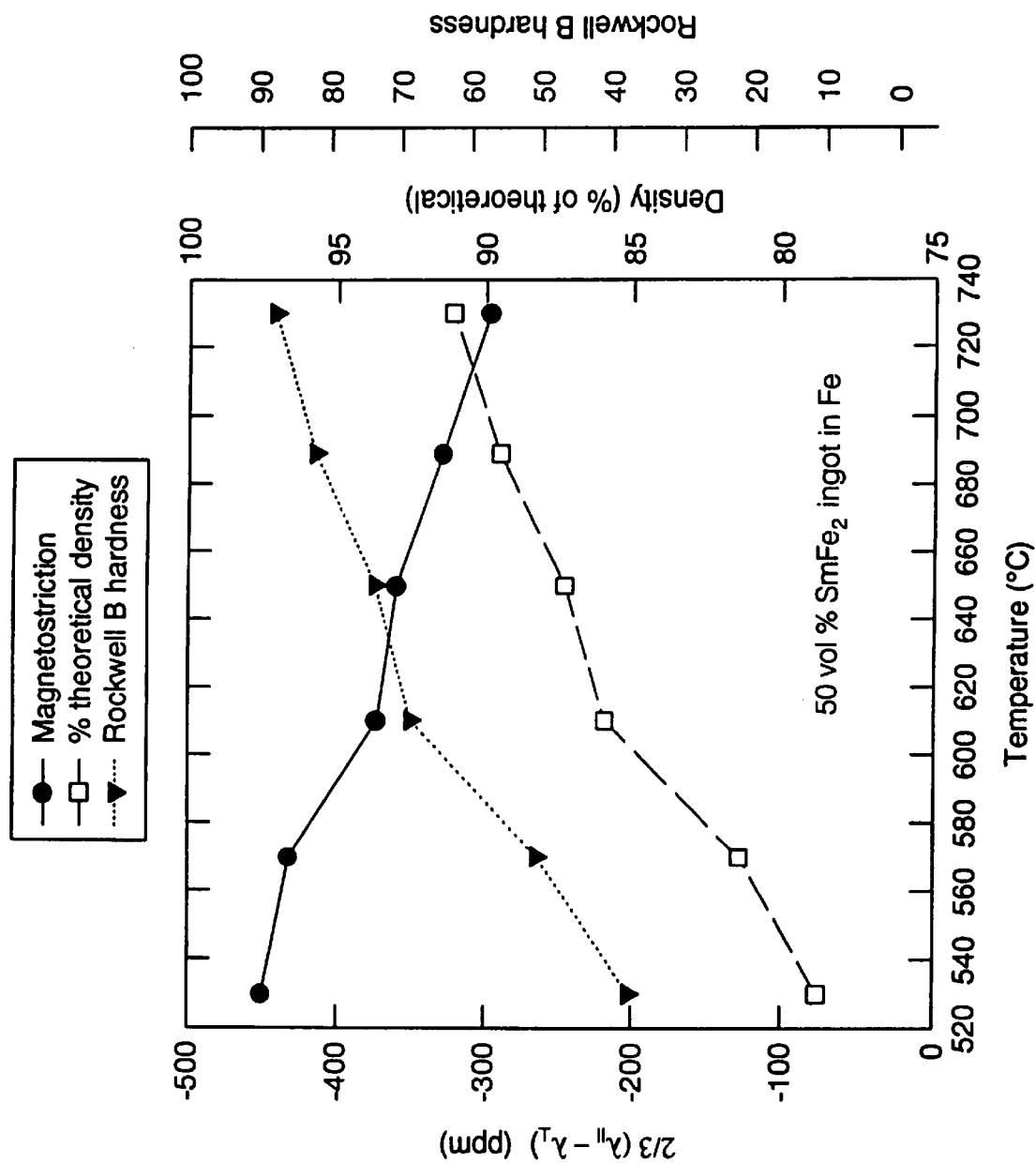
FIG. 7 consists of graphs of the dependence of the magnetostriction ⅔($\lambda_\parallel-\lambda_\perp$) at H=19 kOe (●), the density ρ normalized to the theoretical density ρ$_{theoretical}$ (□), and the hardness (▼) on the hot press temperature in 50 vol % SmFe$_2$ composites with Fe.
Figure 8:
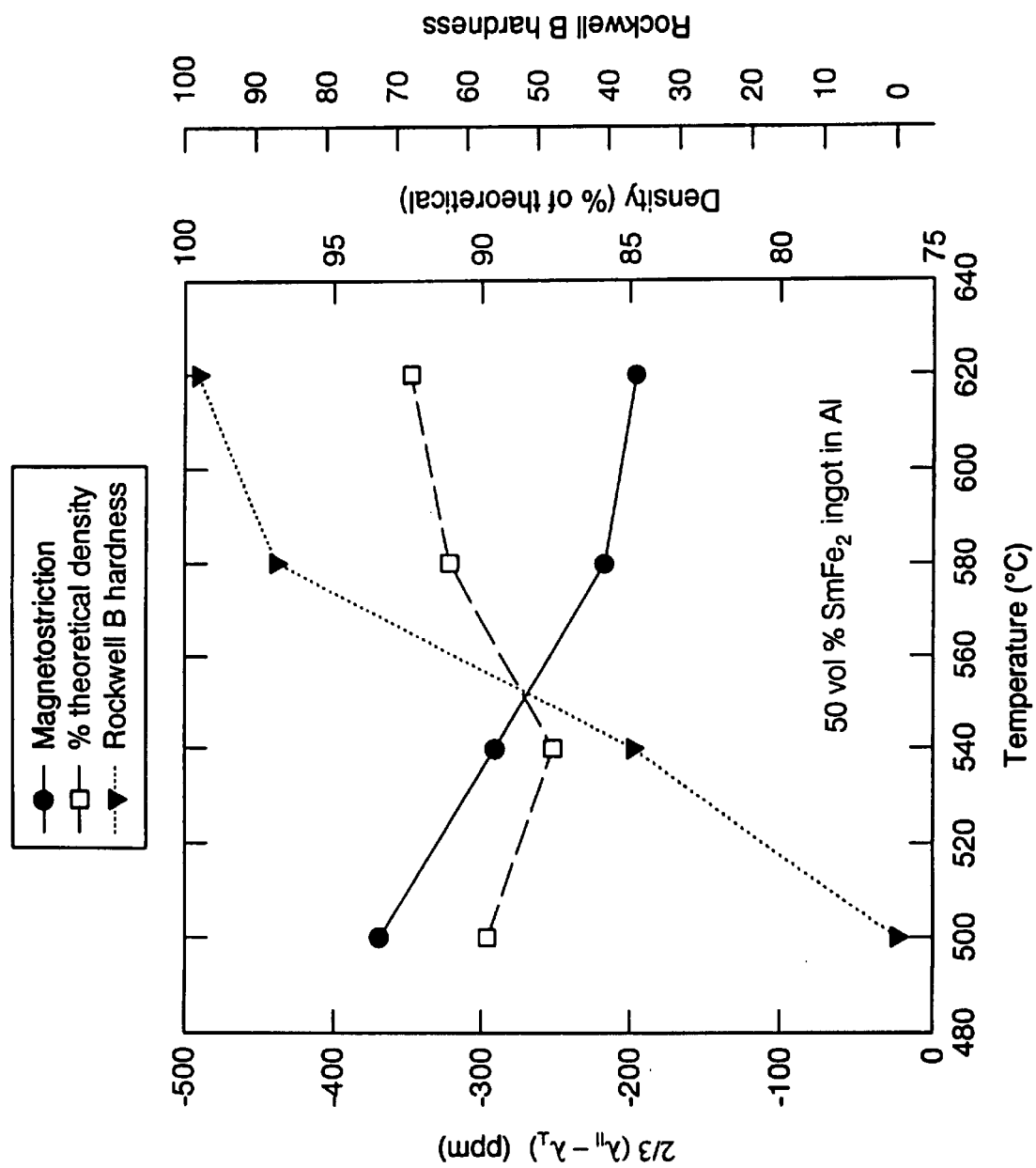
FIG. 8 consists of graphs of the dependence of the magnetostriction ⅔(●) at H=19 kOe (●), the density ρ normalized to the theoretical density ρ$_{theoretical}$ (□), and the hardness (▼) on the hot press temperature in 50 vol % SmFe$_2$ composites with Al.
Figure 9:
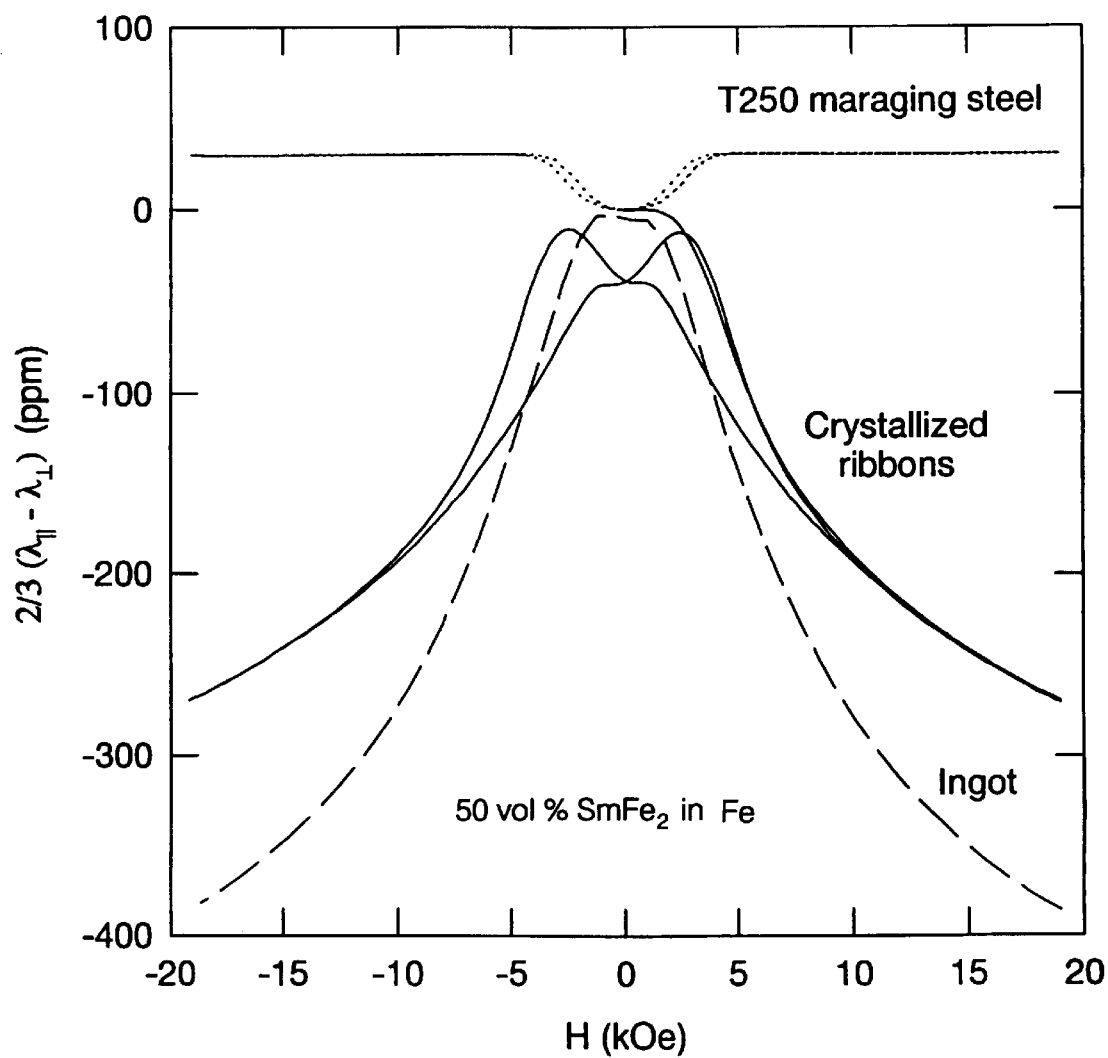
FIG. 9 is a plot of magnetostriction ⅔($\lambda_\parallel-\lambda_\perp$) in ppm as a function of applied magnetic field H for hot pressed SmFe$_2$/Fe composites made at 50% fill fractions.
Figure 10:
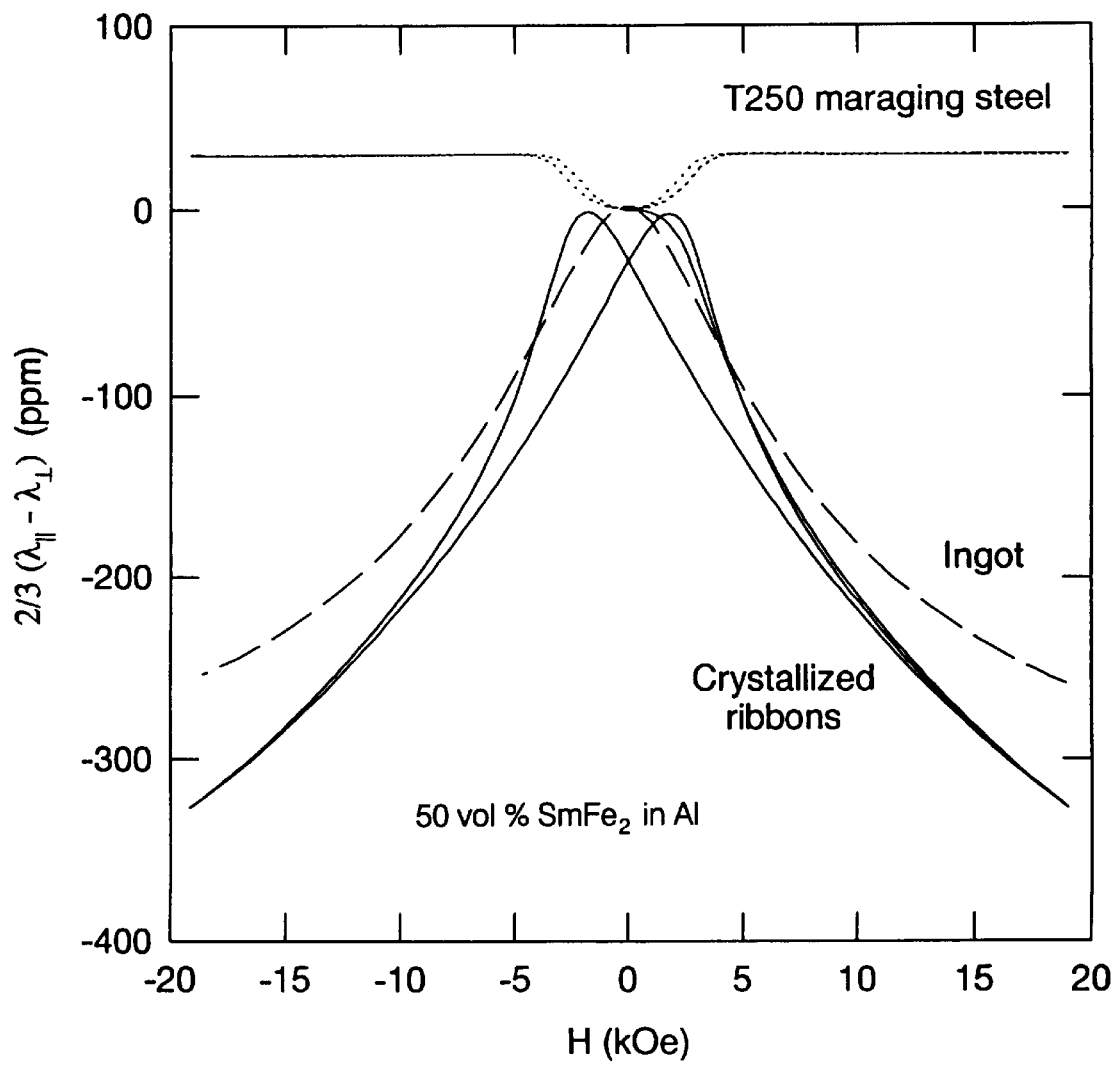
FIG. 10 is a plot of magnetostriction ⅔($\lambda_\parallel-\lambda_\perp$) in ppm as a function of applied magnetic field H for hot pressed SmFe$_2$/Al composites made at 50% fill fractions.
Figure 11:
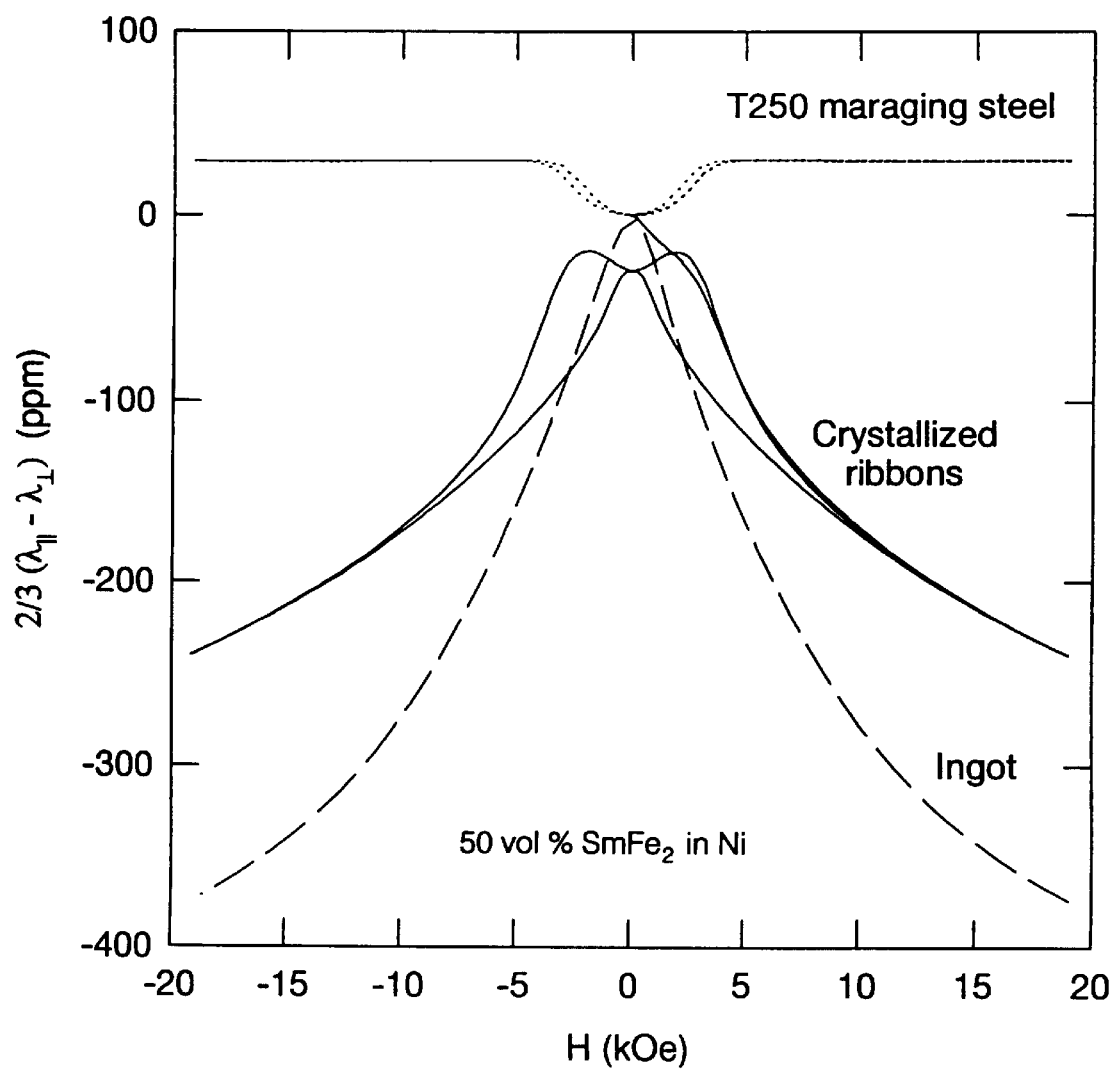
FIG. 11 is a plot of magnetostriction ⅔($\lambda_\parallel-\lambda_\perp$) in ppm as a function of applied magnetic field H for hot pressed SmFe$_2$/Ni composites made at 50% fill fractions.
Figure 12:
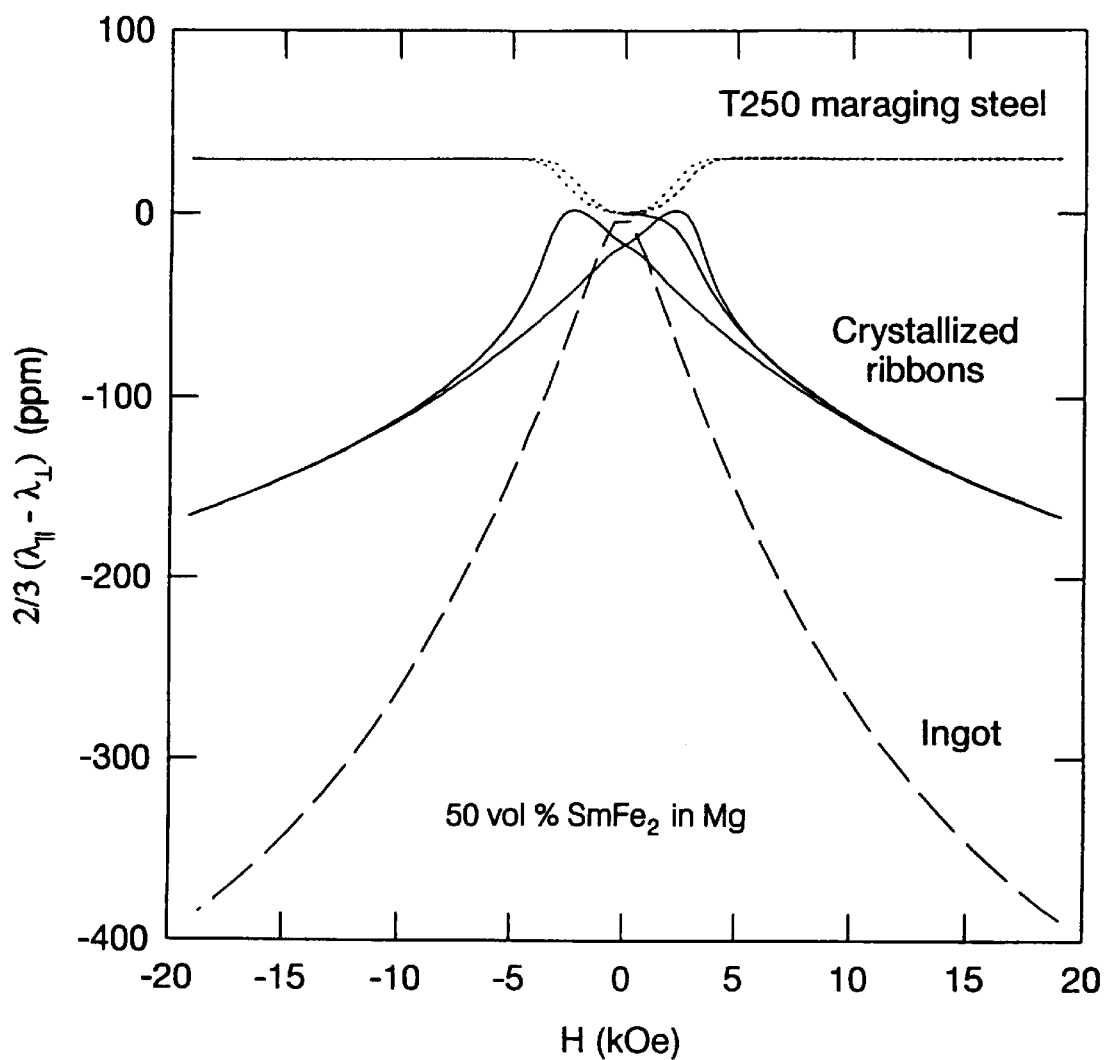
FIG. 12 is a plot of magnetostriction ⅔($\lambda_\parallel-\lambda_\perp$) in ppm as a function of applied magnetic field H for hot pressed SmFe$_2$/Mg composites made at 50% fill fractions.
Figure 13:
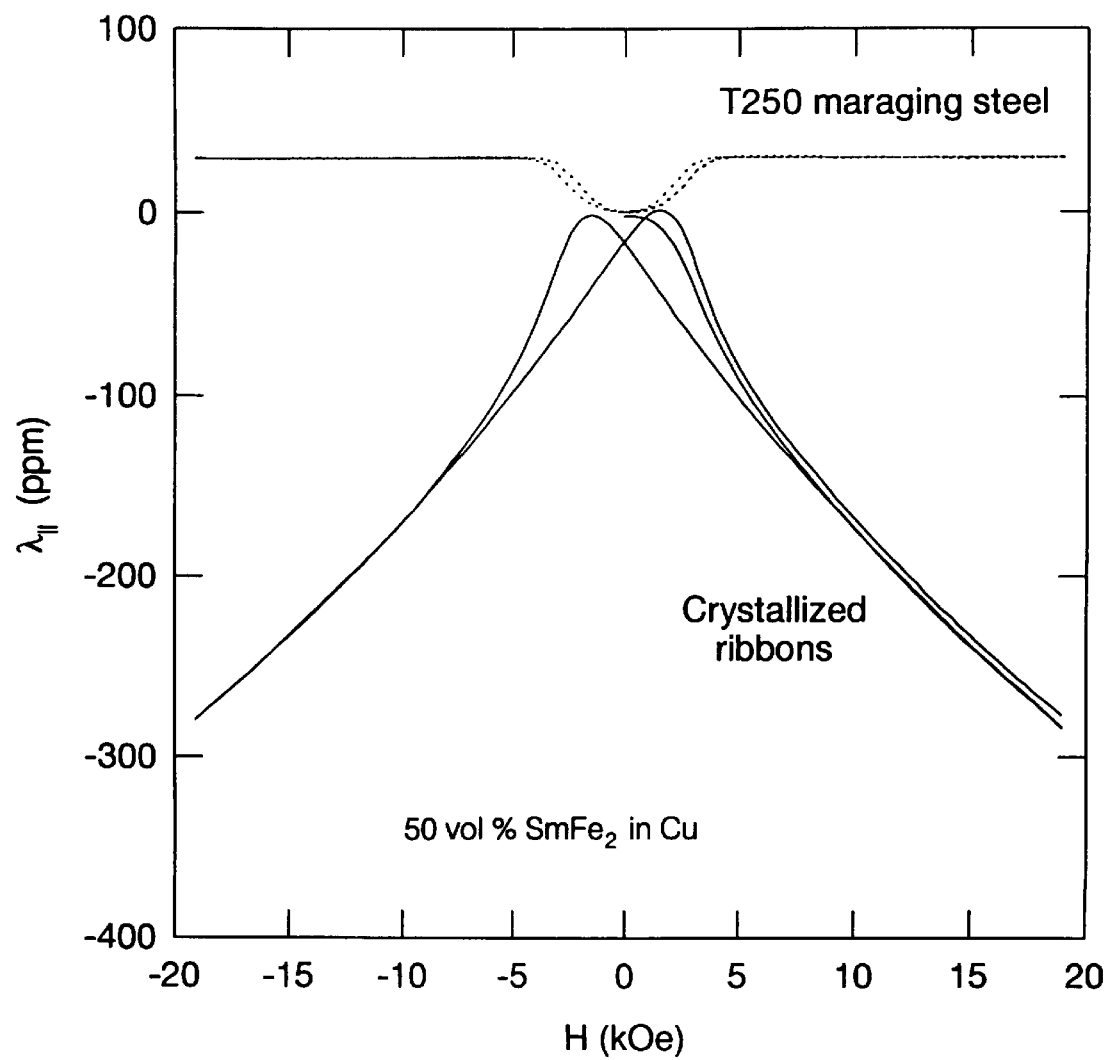
FIG. 13 is a plot of magnetostriction ⅔($\lambda_\parallel-\lambda_\perp$) in ppm as a function of applied magnetic field H for hot pressed SmFe$_2$/Cu composites made at 50% fill fractions.

The hot press temperature is varied in FIGS. 7 and 8 for composites made at 50 vol % $SmFe_2$ with iron and aluminum, respectively. In both cases, the magnetostriction decreases slowly with increasing hot press temperature. This loss is ascribed to chemical reaction between the $SmFe_2$ and the iron or aluminum matrix at elevated temperature which converts part of the material at the particle interfaces into additional low magnetostrictive rare earth-iron or rare earth-aluminum phases.

FIGS. 5 through 8 indicate that the mechanical and magnetostrictive properties can be balanced for the requirements of a specific application via appropriate selections of fill fraction and hot press temperature. FIGS. 7 and 8 show that higher hot press temperature leads to significantly better hardness and higher density, but reduced magnetostriction. As FIGS. 5 and 6 demonstrate, however, the latter can be at least partially compensated by increasing the fill fraction of the magnetostrictive component.

It is to be recognized that the magnetostriction data summarized in FIGS. 7 and 8 were obtained on hot pressed composites that had experienced hot pressing temperatures for only 10 minutes or less. It is believed that retention of relatively high magnetostriction in all of the subject samples is due to preventing unnecessary prolonged exposure of the composite mixtures to high temperatures during pressing.

$SmFe_2$ Composites with Copper, Nickel or Magnesium Matrix Metal

A series of composite specimens was prepared using $SmFe_2$ particles with matrix metals other than iron and aluminum. The practice of this invention is also demonstrated using copper, magnesium or nickel as the matrix material. Since it has been demonstrated that composites of equal parts by volume of $RE-Fe_2$ magnetostrictor and matrix metal provide a very suitable balance of magnetostriction and mechanical properties, such composites were chosen for the following examples.

The specimens were prepared using either $SmFe_2$ ingot particles or crystallized melt-spun ribbon particles to make 50% $SmFe_2$ fill ratio composite with copper or magnesium or nickel. The respective forms of $SmFe_2$ particles were prepared as described above. These magnetostrictive particles were mixed with elemental copper or magnesium or nickel particles and hot pressed as described above into cylindrical discs of 12.7 mm diameter and 7 mm long. The copper matrix composites were pressed at 470° C. The nickel composites were pressed at 610° C. and the magnesium composites at 575° C. to 610° C. The composites were all pressed at 95 MPa and remained at their respective hot press temperatures for no more than 10 minutes. Like samples with iron and aluminum as matrix metal were prepared for direct comparison of magnetostrictive values.

FIGS. 9 through 13 are graphs of magnetostriction $\frac{2}{3}(\lambda_{\parallel} - \lambda_{\perp})$ in ppm for the iron matrix, aluminum matrix, nickel matrix, magnesium matrix and copper matrix composites, respectively. In each example, the composites were subjected to an applied magnetic field that was varied from +19 kOe to −19 kOe and back to +19 kOe. Like magnetostriction data for T250 maraging steel is included on each plot for comparison. It is again observed that the magnetostriction of maraging steel is positive, although quite small, while that of the $SmFe_2$-containing composites is negative. The maraging steel magnetostriction curve reaches saturation at less than H=5 kOe while the $RE-Fe_2$ samples do not reach saturation in an applied field of 19 kOe. From the displacement of the peaks in the magnetostriction curves from H=0 in FIGS. 9–13, it is evident that the composites containing melt-spun $SmFe_2$ particles possess appreciable coercivity which is not present in the $SmFe_2$ ingot powders or in the maraging steel samples.

The copper matrix, magnesium matrix and nickel matrix composites had mechanical properties comparable to the aluminum and iron matrix composites described above. Thus, it is clear that this invention provides a family of useful magnetostrictive composites that offers a balance of high magnetostriction and suitable mechanical properties. The subject composites have sufficient strength and hardness such that they can be drilled or otherwise mechanically worked and they can survive aggressive environments or applications such as are encountered in automobile and truck components. Furthermore, these composites can provide suitable magnetostriction for use in sensor or transducer applications on such vehicles. When the magnetostrictive intermetallic compound phase is initially prepared as suitably crystallized, melt-spun ribbon particles, such particles and the resulting composite display magnetic coercivity.

An important feature of the processing aspect of this invention is that the duration of the hot pressing step be managed and limited so as to obtain suitable strength and density without unacceptable degradation of the magnetostriction. In general, it is preferred that the time that the composite is held at its hot pressing temperature be no more than about 20 minutes.

While this invention has been described in terms of certain preferred embodiments thereof, it will be appreciated that other forms could readily be adapted by one skilled in the art. Accordingly, the scope of this invention is to be considered limited only by the following claims.

We claim:

1. A magnetostrictive composite body consisting essentially of discrete particles of magnetostrictive material selected from the group consisting of (i) substantially single phase particles of the magnetostrictive intermetallic compound RE-Fe$_2$, where RE is one or more rare earth elements, and/or (ii) amorphous particles of corresponding elemental composition, embedded in a strengthening metal matrix phase formed by hot mechanical compaction and deformation of particles of a deformable metal, the density of said composite being 70% or more of its theoretical density based on the actual densities of said deformable metal and said magnetostrictive material and the magnitude of the magnetostriction $|\frac{2}{3}(\lambda_{\parallel}-\lambda_{\perp})|$ is greater than 85 ppm in an applied magnetic field of 19 kOe.

2. A magnetostrictive composite body as recited in claim 1 in which RE comprises samarium or terbium.

3. A magnetostrictive composite body as recited in claim 1 in which said deformable metal is selected from the group consisting of aluminum, copper, iron, magnesium and nickel.

4. A magnetostrictive composite body as recited in claim 1 in which said magnetostrictive composite comprises magnetically coercive RE-Fe$_2$ particles made by crystallizing melt-spun ribbons of said composition.

5. A magnetostrictive composite body as recited in claim 1 in which the deformable metal comprises aluminum, and the composite has a magnetostriction $|\frac{2}{3}(\lambda_{\parallel}-\lambda_{\perp})|$ in excess of 100 ppm in magnitude in an applied magnetic field of 19 kOe.

6. A magnetostrictive composite body as recited in claim 5 in which said magnetostrictive composite comprises magnetically coercive RE-Fe$_2$ particles made by crystallizing melt-spun ribbons of said composition.

7. A magnetostrictive composite body as recited in any of claims 1 through 6 in which said body contains 30% to 80% by volume of said discrete particles of magnetostrictive material.

* * * * *